(12) United States Patent
Harada et al.

(10) Patent No.: US 7,119,011 B2
(45) Date of Patent: Oct. 10, 2006

(54) SEMICONDUCTOR DEVICE AND MANUFACTURING METHOD THEREOF

(75) Inventors: Akitoshi Harada, Nirasaki (JP); Shin Okamoto, Nirasaki (JP); Koichiro Inazawa, Beverly, MA (US)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/845,581

(22) Filed: May 14, 2004

(65) Prior Publication Data

US 2004/0256726 A1 Dec. 23, 2004

(30) Foreign Application Priority Data

May 16, 2003 (JP) .............................. 2003-138389

(51) Int. Cl.
*H01L 21/4763* (2006.01)
(52) U.S. Cl. ...................... 438/640; 438/637; 438/638; 438/639
(58) Field of Classification Search ................. None
See application file for complete search history.

(56) References Cited

U.S. PATENT DOCUMENTS 6,498,399 B1* 12/2002 Chung et al. ............... 257/774

FOREIGN PATENT DOCUMENTS

JP 2001-060582 3/2001

* cited by examiner

*Primary Examiner*—Michael Lebentritt
*Assistant Examiner*—Cheung Lee
(74) *Attorney, Agent, or Firm*—Smith, Gambrell & Russell, LLP

(57) ABSTRACT

This semiconductor device includes a substrate 60 to be processed, a first insulation film 64 arranged at a designated position on the substrate 60 to have a via-hole 71a, an organic film 65 formed on the first insulation film 64 and a second insulation film 66 formed on the organic film 65. Both of the organic film 65 and the second insulation film 66 have a trench 71b in communication with the via-hole 71a, in common. Additionally, a manufacturing method of this semiconductor device includes the processes of forming the organic film 65 on the substrate 60 to be processed, forming a film having a designated pattern on the organic film 65 while exposing a part of the organic film 65, and removing the exposed part of the organic film 65 from the substrate 60 to expose a foundation layer of the organic film 65.

7 Claims, 10 Drawing Sheets

SEMICONDUCTOR DEVICE AND MANUFACTURING METHOD THEREOF

BACKGROUND OF THE INVENTION

1. Field of the Invention

This invention relates to a semiconductor device including a groove interconnecting element, such as Dual Damascene structure, and a manufacturing method of the semiconductor device.

2. Background Art

In the manufacturing process of a semiconductor device, recently, the Dual Damascene fabrication technology is widely adopted in order to form multilayer interconnections in the device. FIGS. 9A to 9E are explanatory views showing one example of fabrication processes of multilayer interconnections by the Dual Damascene fabrication technology. First, lower interconnections 93 made of copper etc. are formed on the surface of a semiconductor wafer W (indicated with "Si-sub" in FIGS. 9A to 9E). Next, as a first insulation film 94, a silicon oxide film ($SiO_2$-film) is formed so as to cover the lower interconnections 93 on the wafer W. Further, as a first intermediate film 95, a silicon nitride film (SiN-film) is formed on the first insulation film 94 and subjected to patterning. In the patterning of the first intermediate film 95, an opening 95a narrower than the width of the lower interconnection 93 is formed in an area where a via-hole 99a is formed subsequently and where a groove interconnection using the via-hole 99a is connected to the lower interconnection 93 (see FIG. 9A).

Next, a $SiO_2$-film as a second insulation film 96 is formed on the first intermediate film 95. This second insulation film 96 is formed so that the opening 95a is embedded by silicon oxide ($SiO_2$) (see FIG. 9B). Subsequently, as a second intermediate film 97, a silicon nitride film (SiN-film) is formed on the second insulation film 96 and thereafter, a photo-resist film 98 is formed on the second intermediate film 97. Then, by photo lithography technology, openings are formed in the photo-resist film 98. In succession, by etching the second intermediate film 97 while masking the photo-resist film 98, openings 97a are formed in the second intermediate film 97 (see FIG. 9C).

After removing the photo-resist film 98, the first insulation film 94 and the second insulation film 96 are etched while utilizing the second intermediate film 97 as an etching mask and also utilizing the first intermediate film 95 as an etching stopper layer (FIG. 9D). Consequently, the via-hole 99a and a trench 99b are formed in the first insulation film 94 and the second insulation film 96 (see Japanese Patent Publication No. 2001-60582, $3^{rd.}$ paragraph to $6^{th.}$ paragraph).

In case of the dual damascene method mentioned above, however, the first intermediate film 95 formed between the first insulation film 94 and the second insulation film 96 in order to form the via-hole 99a has a dielectric constant higher than respective dielectric constants of the first insulation film 94 and the second insulation film 96, causing a problem in the advance of development of semiconductor devices, such as LSI (Large Scale Integrated circuit) of recent years. For instance, in the development of semiconductor devices of recent years, there has been developed an interlayer insulation film of low dielectric, namely, low-k film (or low-εfilm) as the first insulation film 94 and the second insulation film 96, in view of speeding-up, low consumption of power, etc. of the semiconductor device. In the method shown in FIGS. 9A to 9E, however, there is a problem that the first intermediate film 95 increases the dielectric constant of the whole insulating layers (lamination of the first insulation film 94, the first intermediate film 95 and the second insulating film 96).

In order to solve the above-mentioned problem, there is known a fabrication process of multilayer interconnection by the dual damascene method shown in FIGS. 10A to 10C. According to the method of FIGS. 10A to 10C, it is firstly performed to form an insulation film 82 on a wafer W having a lower interconnection 81 formed thereon and subsequently, a via-hole 82a is formed in the insulation film 82 (see FIG. 10A). Next, an intermediate film 83, such as antireflection film, is formed on the insulation film 82. Next, a photo-resist film 84 is formed on the intermediate film and thereafter, it is performed to expose and develop the photo-resist film 84 in the patterning process (see FIG. 10B). In succession, the wafer W is etched with use of the photo-resist film 84 as an etching stopper layer. Consequently, both upper portions of the intermediate film 83 and the insulation film 82 are etched, so that a trench 82b is formed in communication with the via-hole 82a (see FIG. 10C).

Although this application of the dual damascene method of FIGS. 10A to 10C has an advantage of avoiding the increase in dielectric constant of the insulation film 82 (in case of low-k film) because of no formation of an intermediate film in the insulation film 82, there is a possibility that when etching the wafer W in order to form the trench 82b, its bottom surface 85 is coarsened disadvantageously, requiring a new process to smooth such a roughness on the bottom surface 85.

SUMMARY OF THE INVENTION

In the above-mentioned situation, it is an object of the present invention to provide a semiconductor device having an insulation film whose increase in terms of dielectric constant is suppressed and also a trench having a smooth bottom surface, and a manufacturing method of the semiconductor device. Additionally, it is another object of the present invention to provide a method of manufacturing a semiconductor device having a smooth bottom surface without requiring a new processing.

The first feature of the present invention resides in the provision of a semiconductor device comprising: a substrate to be processed; a first insulation film arranged at a designated position on the substrate to be processed, the first insulation film having a via-hole; an organic film formed on the first insulation film; and a second insulation film formed on the organic film, wherein both of the organic film and the second insulation film have a trench in communication with the via-hole, in common.

The second feature of the invention resides in that the first insulation film and/or the second insulation film is porous.

The third feature of the invention resides in that the semiconductor device of the first feature further comprises a lower interconnection arranged under the via-hole and formed with a designated pattern, wherein, on condition of filling the via-hole with an conductive material, the semiconductor device has a damascene structure where the conductive material is electrically connected to the lower interconnection.

The fourth feature of the invention resides in that the organic film has its thickness more than 10 nm and less than 50 nm.

The fifth feature of the invention resides in that a dielectric constant of the organic film is 3.5 or less.

In the semiconductor device having the above-mentioned structure, the bottom surface of the trench is smooth. Further, the semiconductor device where the increase in dielectric constant of the whole insulation film (which is composed of the first insulation film, the organic film and the second insulation film) is suppressed, is provided.

The sixth feature of the invention resides in the provision of a manufacturing method of a semiconductor device, comprising the steps of: forming an organic film on a substrate to be processed; forming a film having a designated pattern on the organic film while exposing a part of the organic film to an outside thereof; and removing the exposed part of the organic film from the substrate to be processed thereby exposing a foundation layer of the organic film.

The seventh feature of the invention resides in the provision of a manufacturing method of a semiconductor device, comprising the steps of: forming an organic film on a substrate to be processed; forming an insulation film on the organic film; forming a resist film having a designated pattern on the insulation film; forming at least either a groove or a hole each reaching a top surface of the organic film in accordance with the designated pattern of the resist film; and removing the resist film and an exposed part of the organic film to at least either the groove or the hole, from the substrate to be processed, simultaneously.

The eighth feature of the invention resides in the provision of a manufacturing method of a semiconductor device having a groove interconnecting element of damascene structure, comprising the steps of: forming a first insulation film on a substrate to be processed; forming an organic film on the first insulation film; forming a via-hole penetrating the first insulation film and the organic film; embedding a conductive material in the via-hole; forming a second insulation film on the organic film; forming an etching mask having a designated pattern on the second insulation film; forming a trench reaching a top surface of the organic film in accordance with the designated pattern of the etching mask; and removing an exposed part of the organic film to the trench, from the substrate to be processed.

The ninth feature of the invention resides in that the first insulation film and/or the second insulation film is porous.

The tenth feature of the invention resides in that the step of removing the part of the organic film exposing to the trench from the substrate to be processed, is carried out by ashing. Owing to the adoption of ashing, it is possible to smooth the top surface of the first insulation film (i.e. the bottom surface of the trench) exposed as a result of removing the organic film. When the etching mask is formed by a resist film, the ashing process allows the organic film and the resist film to be removed from the substrate to be processed simultaneously. Thus, even if the organic film is introduced into the insulation layers (i.e. the first insulation film and the second insulation film), there is no need to provide a new process to remove the organic film.

The eleventh feature of the invention resides in that the manufacturing method of the eighth feature further comprises the step of forming a patterned lower interconnection on the surface of the substrate to be processed before the step of forming the first insulation film, wherein the via-hole is formed on the patterned lower interconnection.

The twelfth feature of the invention resides in that a thickness of the organic film is 10 nm or more, and 50 nm or less.

The thirteenth feature of the invention resides in that a dielectric constant of the organic film is 3.5 or less. In this feature, it is possible to reduce increase of dielectric constant of the insulating layers as a whole.

The fourteenth feature of the invention resides in that the etching mask is a resist film, and not only the part of the organic film exposing to the trench but the resist film is removed simultaneously from the substrate to be processed in the step of removing the part of the organic film exposing to the trench from the substrate to be processed.

The fifteenth feature of the invention resides in the provision of a manufacturing method of a semiconductor device having a groove interconnecting element of damascene structure, comprising the steps of: forming a first insulation film on a substrate to be processed; forming an organic film on the first insulation film; forming a second insulation film on the organic film; forming a via-hole penetrating the first insulation film, the organic film and the second insulation film; forming a sacrifice film on the second insulation film so as to embed the sacrifice film in the via-hole; forming an etching mask having a designated pattern on the sacrifice film; forming a trench reaching a top surface of the organic film in accordance with the designated pattern of the etching mask; and removing an exposed part of the organic film to the trench, from the substrate to be processed.

The sixteenth feature of the invention resides in that the first insulation film and/or the second insulation film is porous.

The seventeenth feature of the invention resides in that the step of removing an exposed part of the organic film to the trench is carried out by means of ashing. Owing to the adoption of ashing, it is possible to smooth the top surface of the first insulation film (i.e. the bottom surface of the trench) exposed as a result of removing the organic film. When the etching mask is formed by a resist film, the ashing process allows the organic film and the resist film to be removed from the substrate to be processed simultaneously. Thus, even if the organic film is introduced into the insulation layers (i.e. the first insulation film and the second insulation film), there is no need to provide a new process to remove the organic film.

The eighteenth feature of the invention resides in that the manufacturing method of the fifteenth feature of the invention further comprises the step of forming a patterned lower interconnection on the surface of the substrate to be processed before the step of forming the first insulation film, wherein the via-hole is formed on the patterned lower interconnection.

The nineteenth feature of the invention resides in that a thickness of the organic film is 10 nm or more, and 50 nm or less.

The twentieth feature of the invention resides in that the a dielectric constant of the organic film is 3.5 or less.

The twenty-first feature of the invention resides in that the etching mask is a resist film, and not only the part of the organic film exposing to the trench but the resist film is removed simultaneously from the substrate to be processed in the step of removing the part of the organic film exposing to the trench from the substrate to be processed.

These and other objects and features of the present invention will become more fully apparent from the following description and appended claims taken in conjunction with the accompany drawings.

DESCRIPTION OF THE PREFERRED EMBODIMENT

An embodiment of the present invention will be described with reference to FIGS. 1 to 8C. Here, a substrate to be processed is illustrated by an example of semiconductor water and further, a method of forming a groove interconnecting element of the dual damascene structure on the semiconductor water at its designated position will be described below.

Figure 1:
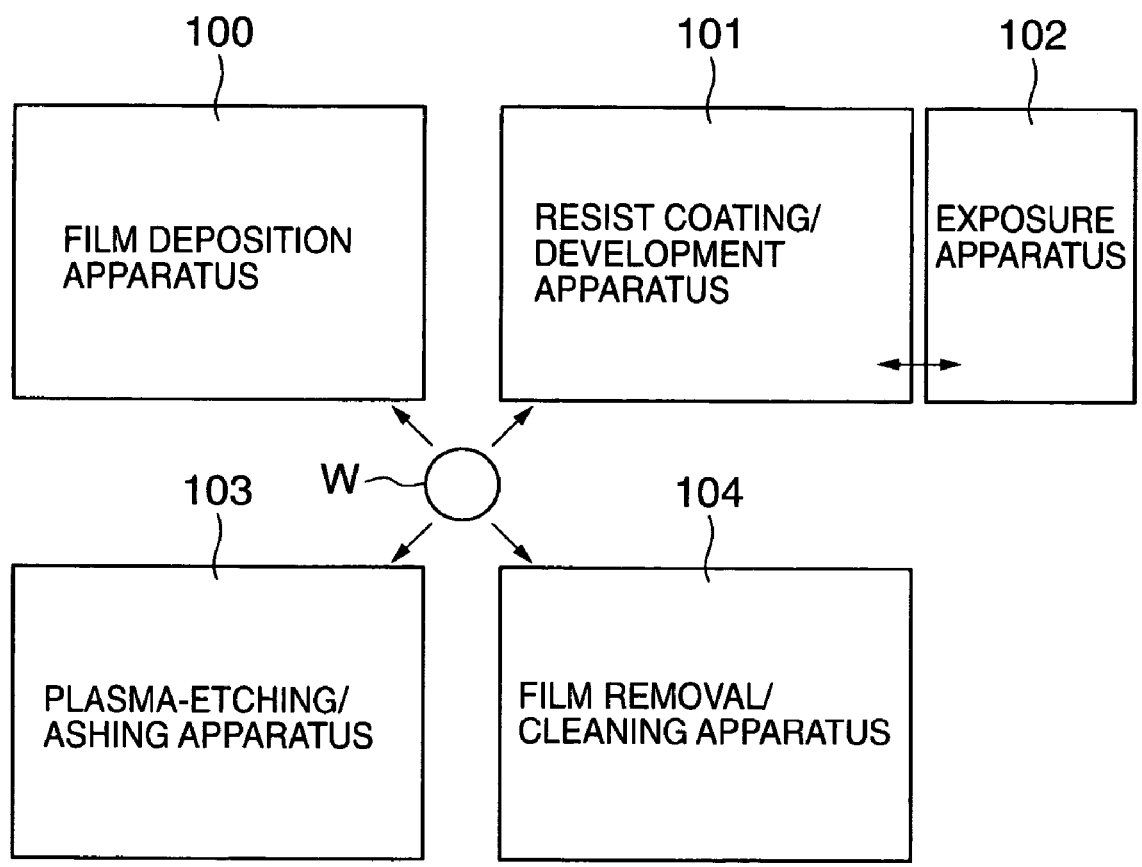
FIG. 1 is a view explaining the schematic arrangement of a damascene fabrication system.

FIG. 1 is a view explaining the schematic arrangement of a damascene fabrication system that can be used to form an insulation film (interlayer insulation film) on a wafer W and also form via-holes and trenches in the insulation film. This damascene fabrication system includes a film deposition apparatus 100, a resist application/development apparatus 101, an exposure apparatus 102, a plasma etching/ashing apparatus 103 and a film-removal/cleaning apparatus 104, allowing the wafer W to be transferred among these apparatuses by aid of a not-shown transfer machine.

As the film deposition apparatus 100, there can be enumerated a CVD apparatus capable of forming an insulation film, such as 1ow-k film and organic film, on the wafer W by Chemical Vapor Deposition (CVD) method, and a SOD (Spin On Dielectric) apparatus capable of forming an insulation film by the application of a designated chemical liquid on the wafer W.

The resist application/development apparatus 101 is used to form a resist film etc. functioning as an etching mask. Although the detailed structure of the resist application/development apparatus 101 is not shown, the following operations are carried out in the apparatus 101: depositing of a sacrifice film on the wafer W; depositing of a bluing anti-reflection coating (BARC) on the wafer; depositing of a resist film on the wafer W; and developing of the resist film exposed with a designated patter by the exposure apparatus 102.

The exposure apparatus 102 is used to expose a designated pattern on the wafer W having a resist film formed thereon. In the plasma/ashing apparatus 103, an etching process is carried out to form via-holes and trenches in a variety of films formed on the wafer W and furthermore, a designated film is removed from the wafer W by ashing. The details of these operations will be described later. In the film-removal/cleaning apparatus 104, there are carried out to remove unnecessary films produced as a result of the process of forming groove interconnections of dual damascene structure, etch residues produced in the middle of the above process, etc. from the wafer W and to rinse off chemical liquids in the process.

Figure 2:
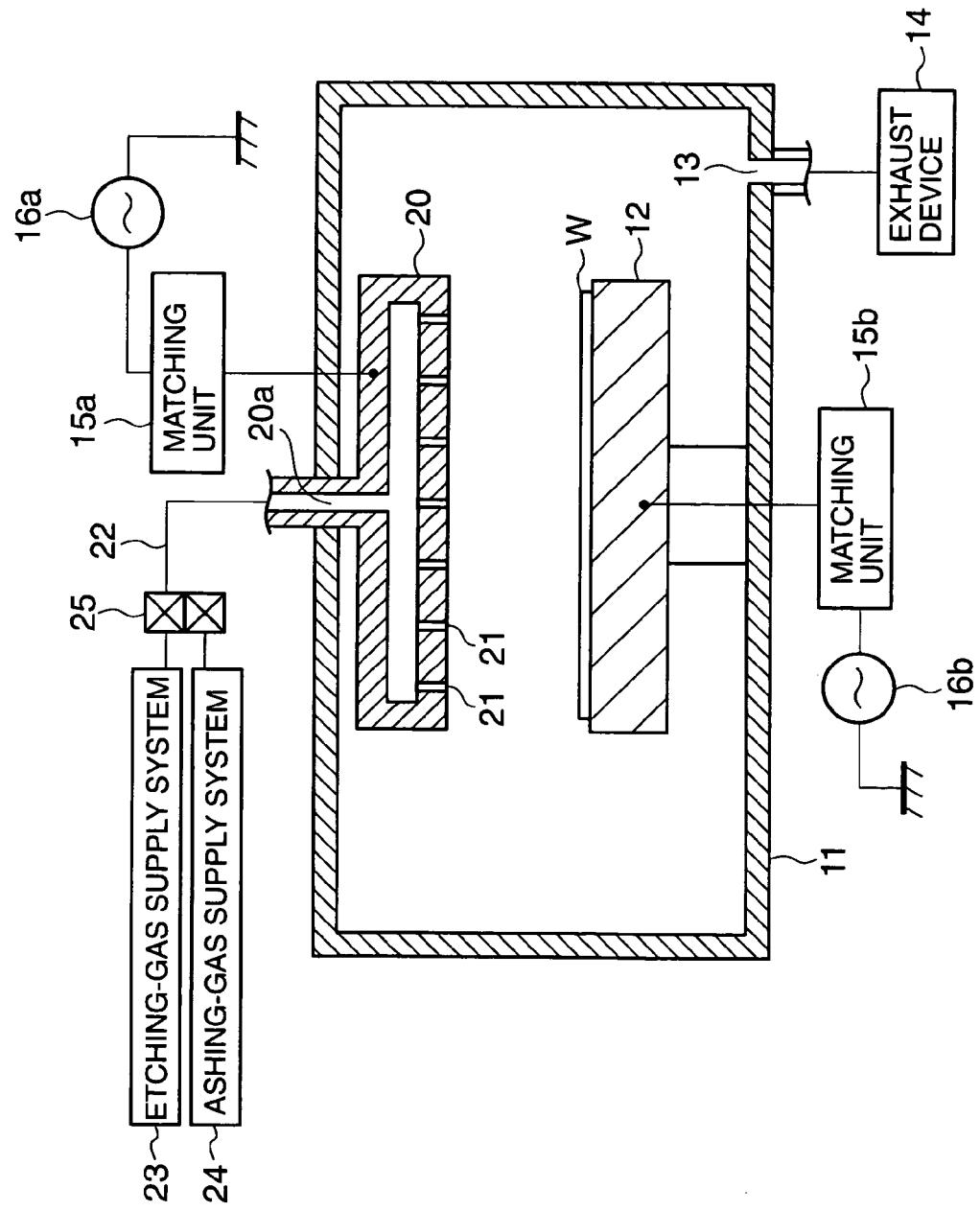
FIG. 2 is a sectional view showing one example of a plasma etching/ashing apparatus used to embody the present invention.

Next, the structure of the plasma/ashing apparatus 103 will be described in detail. FIG. 2 is a schematic sectional view of the plasma/ashing apparatus 103. The plasma/ashing apparatus 103 has an airtight chamber 11 made of e.g. aluminum. In the chamber 11, there is a support table 12 to support the wafer W substantially horizontally. For example, the support table 12 is made of aluminum. An exhaust port 13 is formed in the bottom of the chamber 11. An exhaust device 14 is connected to the exhaust port 13. Due to the exhaust device 14, the interior of the chamber 11 can be depressurized to a designated vacuum.

Above the support table 12, a shower head 20 is arranged so as to face the support table 12 in parallel. The shower head 20 is provided, on its lower surface, with a number of gas discharging holes 21. Above the gas discharging holes 21, a gas introductory part 20a is provided. A gas supply pipe 22 is connected to the gas introductory part 20a. On the other side, the gas supply pipe 22 is connected to an etching-gas supply system 23 for supplying the gas introductory part 20a with etching gas through a switching valve 25 and also connected to an ashing-gas supply system 24 for supplying the gas introductory part 20a with ashing gas through another switching valve 25. As the etching gas to be supplied from the etching-gas supply system 23, there are enumerated halogen gas (e.g. fluorocarbon ($C_xF_y$) gas), $O_2$-gas, Ar-gas, etc. which have been normally used in this field. While, $O_2$-gas is enumerated as the ashing gas to be supplied from the ashing-gas supply system 24.

Through a compliance unit 15a, a first high-frequency source 16a is connected to the shower head 20. This first high-frequency source 16a can generate a high-frequency power ranging from 50 MHz to 150 MHz. Due to such a power supply by the source 16a, it becomes possible to form a plasma with desirable dissociation and high density in the chamber 11. Consequently, a plasma processing under lower pressure conditions can be accomplished than ever before.

Through another compliance unit 15b, a second high-frequency source 16b is connected to the support table 12. This second high-frequency source 16b can generate a high-frequency power ranging from 1 MHz to 4 MHz. Due to the supply of frequency power having such a range to the support table 12, it is possible to apply an appropriate ionic action on the wafer W without damage.

As mentioned above, the support table 12 and the shower head 20 function as a pair of electrodes. Note, a not-shown low-pass filter (LPT) is connected to the shower head 20, while a not-shown high pass filter (HPT) is connected to the support table 12.

Figure 3:
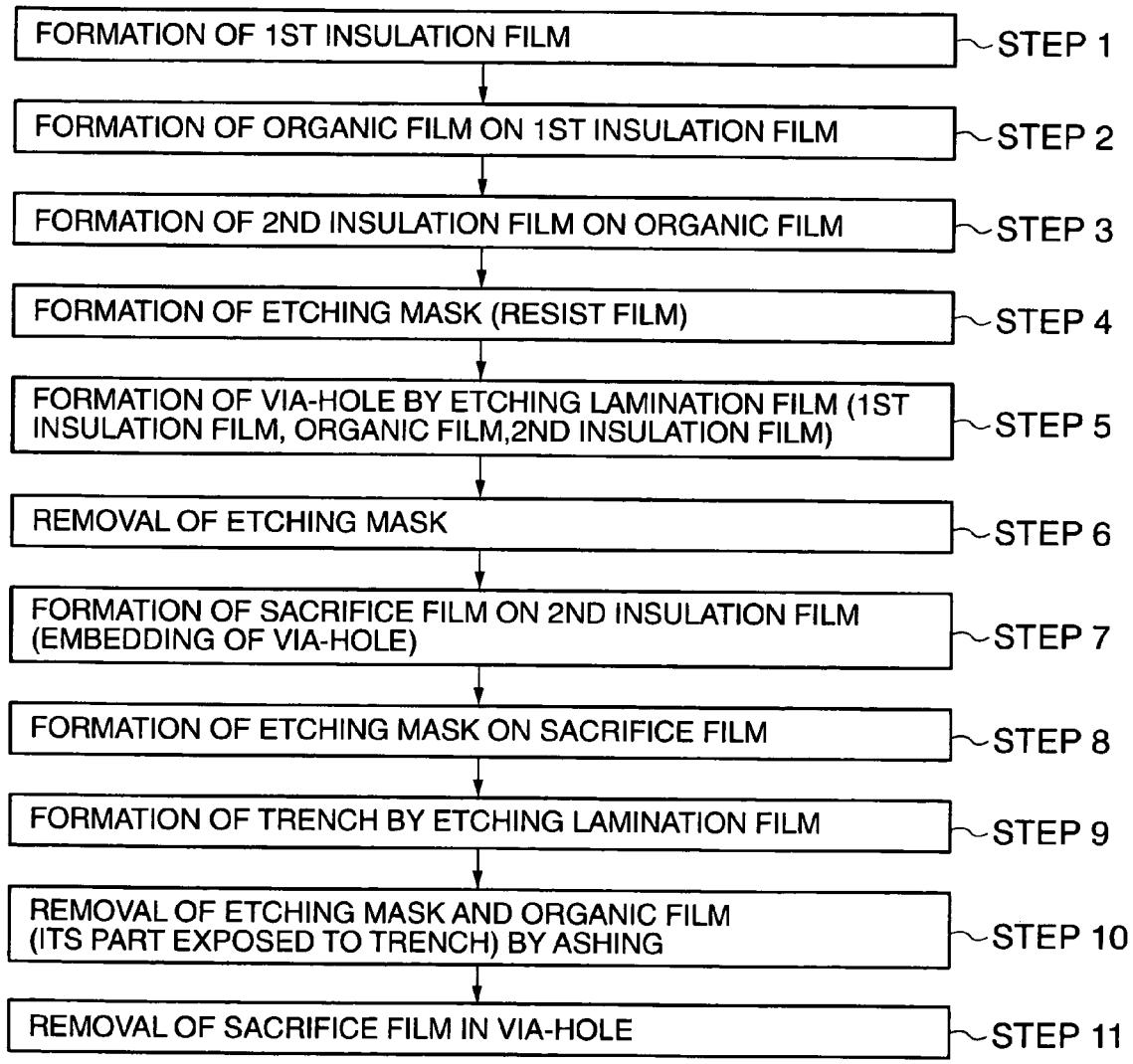
FIG. 3 is a flow chart showing a process of forming a groove interconnecting element in a dual damascene structure.

Next, we describe a method of forming a groove interconnecting element of dual damascene structure in insulation film layers formed on a wafer W while using the above-constructed damascene fabrication system. FIG. 3 is a flow chart showing the fabrication procedure of forming the groove interconnecting element of dual damascene structure. FIGS. 4A to 5D are explanatory views showing the sequential morphological change of insulation films etc. in the formation process of the groove interconnecting element of dual damascene structure.

First of all, a wafer W is prepared although it is not shown in FIGS. 4A to 5D. Here, this wafer W includes an insulation film 60 having a lower interconnection (e.g. copper interconnection) 62 formed therein through a barrier-metal layer 62. Further, the wafer W has a stopper film (e.g. SiN-film SiC-film) 63 formed on the surface of the insulation film 60. After preparing such a wafer W, it is executed to load the wafer W into the film deposition apparatus 100 where a first insulation film 64 (e.g. porous low-k film) is formed on the stopper film 63 (Step 1). Note, the first insulation film 64 may be made of either inorganic material or organic material. Again, the first insulation film 64 may be formed by using either CVD method or application (coating) method.

Next, an organic film 65 is formed on the first insulation film 64 (Step 2). As the organic film 65, it is desirable to employ a material having a dielectric constant less than 3.5 in view of reducing the dielectric constant of the whole insulation layer composed of the first insulation film 64, the organic film 65 and a second insulation film 66 which will be formed on the organic film 65 later. In detail, there is cited an organic material having the dielectric constant of about 3. Additionally, it is preferable in the above view to thin the thickness of the organic film 65 as possible. Nevertheless, in view of enhancing the repeatability of forming the organic film 65 and the process yield of products, there is a limitation to make a thin organic film. Taking the balance of these views into consideration, it is desirable that the organic film 65 has its thickness more than 10 nm and less than 50 nm. Preferably, SOD method is employed as the formation method of the organic film.

Figure 4A:
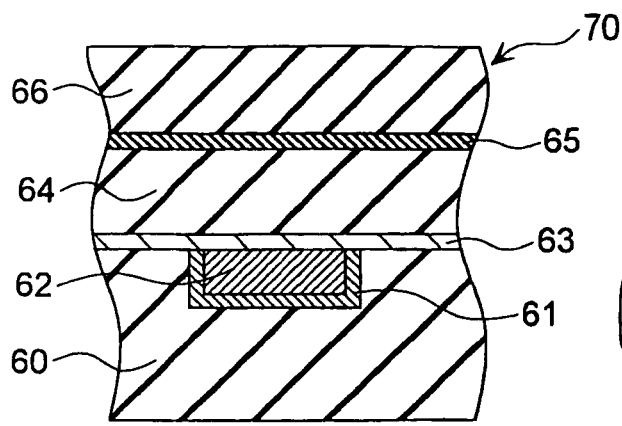
FIGS. 4A to 4E are explanatory views showing the sequential morphological change of insulation films etc. in the fabrication process of the groove interconnecting element in accordance with the flow chart of FIG. 3.

After forming the organic film 65, the second insulation film 66 (low-k film) is formed thereon (Step 3). FIG. 4A illustrates a lamination state after completing the process at step 3. The second insulation film 66 and the first insulation film 64 may be made of the same or different materials. An insulation film where the first insulation film 64, the organic film 65 and the second insulation film 66 are laminated in this order will be called "lamination film 70", hereinafter. Preferably, the lamination film 70 has a dielectric constant less than 3.0.

Figure 4B:
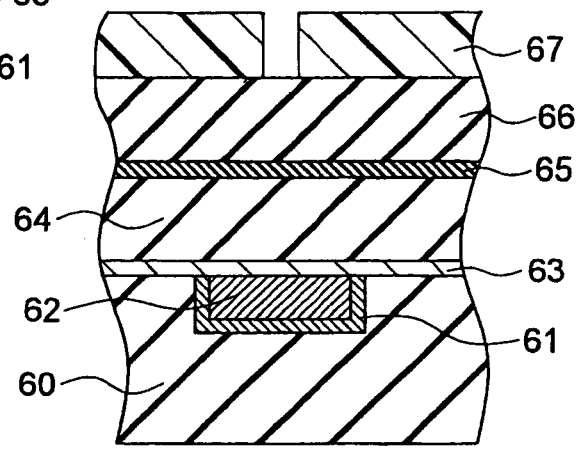

Then, the wafer W is loaded into the resist application/development apparatus 101 where a resist film 67 having a designated circuit pattern and therefore functioning as an etching mask is formed on the second insulation film 66 (Step 4). For example, the resist film 67 may be provided by the following steps of: forming an antireflection film and a resist film on the second insulation film 66 in order; exposing the resist film so as to have the designated circuit pattern by the exposure apparatus 102; and developing the so-exposed resist film in the resist application/development apparatus 101. FIG. 4B shows a state after completing the process at step 4.

Figure 4C:
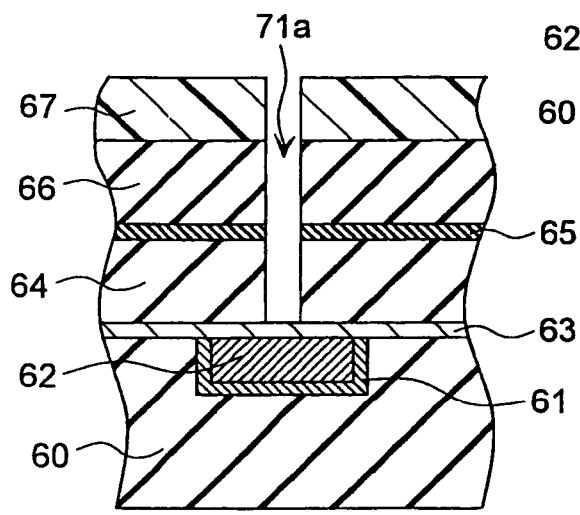

Next, it is executed to transfer the wafer W to the plasma-etching/ashing apparatus 103 and an etching process is executed (Step 5). Consequently, a via-hole 71a penetrating the lamination film 70 and thus reaching the stopper film 63 is formed. FIG. 4C shows a state after completing the process at step 5.

Here, the etching process at the plasma-etching/ashing apparatus 103 will be described below. First, a not-shown gate valve is opened and the wafer W of FIG. 4A is loaded into the chamber 11. After mounting the wafer W on the support table 12, the chamber 11 is exhausted to a designated vacuum by the exhaust device 14. On achievement of the designated vacuum, a designated etching gas is introduced from the etching-gas supply system 23 into the chamber 11 and successively, the shower head 20 and the support table 12 are supplied with respective powers of designated frequencies powers. Consequently, a plasma is produced between the shower head 20 and the support table 12. In the plasma, resulting ions are attracted to the support table 12 (i.e. the wafer W), so that so-enhanced anisotropy in etching causes the lamination film 70 to be etched in accordance with the circuit pattern. In this way, the via-hole 71a is formed in the lamination film 70.

Figure 4D:
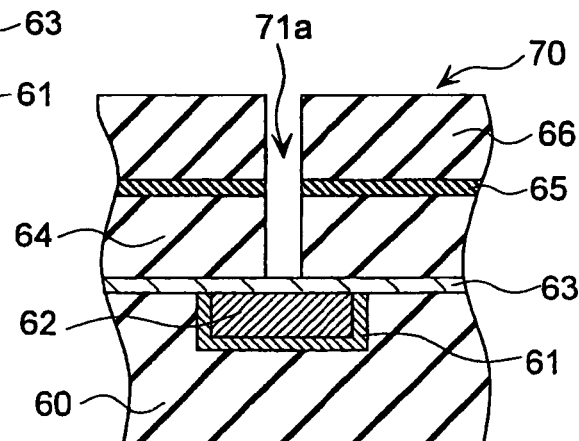

Then, the wafer W having the via-hole 71a formed in the above way is transferred to the film-removal/cleaning apparatus 104 where the resist film 67 is removed from the wafer W by peeling or dissolving the film 67 with a designated chemical liquid (Step 6). The used chemical liquid is rinsed away by the rinsing process. FIG. 4D shows a state after completing the process at step 6.

Figure 4E:
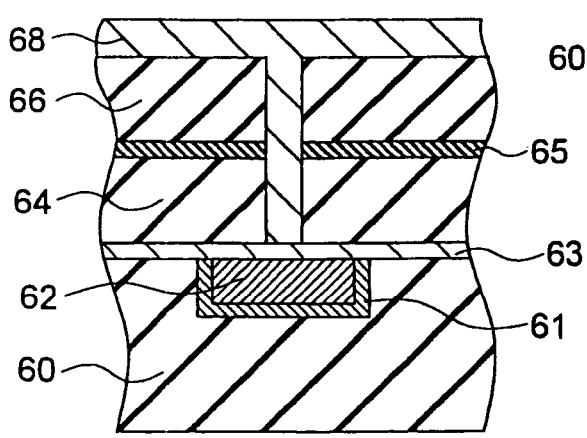
Figure 5A:
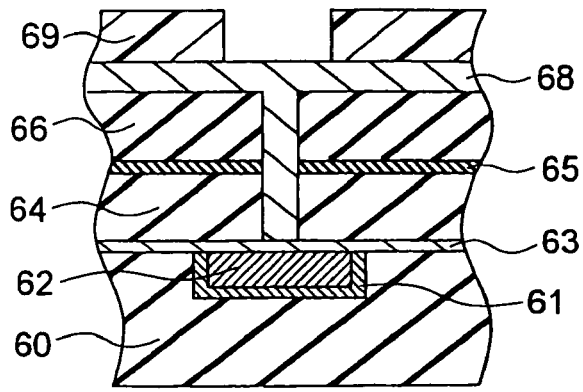
FIGS. 5A to 5D are explanatory views showing the sequential morphological change of insulation films etc. in the fabrication process of the groove interconnecting element in accordance with the flow chart of FIG. 3.

Next, the wafer W is transferred to the resist application/development apparatus 101 where a sacrifice film 68 made of inorganic material (e.g. Si—O materials) is formed on the surface of the second insulation film 66 having the via-hole 71a (Step 7). At this time, the via-hole 71a is embedded with the sacrifice film 68. FIG. 4E shows a state after completing the process at step 7. As similar to the previously-mentioned formation of the resist film 67, a resist film 69 functioning as an etching mask is formed on the sacrifice film 68 (Step 8). Then, the width of each pattern included in the resist film 69 is established wider than the width of the via-hole 71a. FIG. 5A shows a state after completing the process at step 8.

Figure 5B:
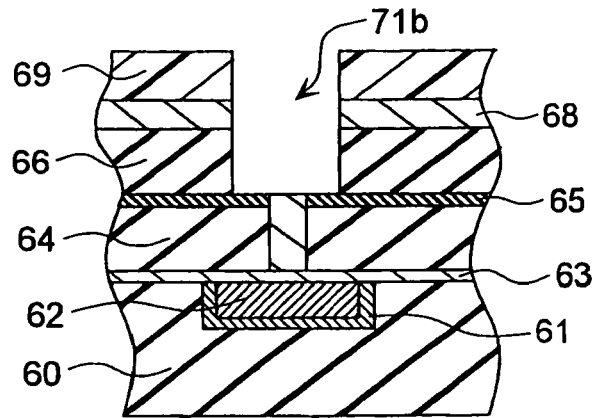

Next, the wafer W is transferred to the etching/ashing apparatus 103 where the etching process is carried out until a groove as a result of etching reaches the organic film 65 (Step 9). Consequently, the upper portion of the via-hole 71a is changed to a trench 71b whose width (diameter) is larger than that of the via-hole 71a. FIG. 5B shows a state after completing the process at step 9. The processing order in forming the trench 71b is similar to the processing order in forming the via-hole 71a previously.

Figure 5C:
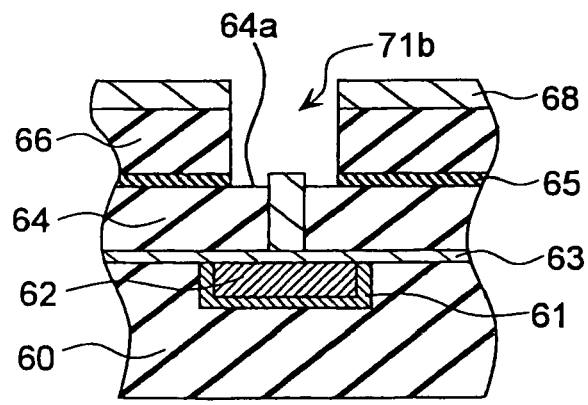

In the plasma-etching/ashing apparatus 103, the wafer W having the trench 71b formed therein is subjected to the ashing process to remove the resist film 69 and an exposed part of the organic film 65 to the trench 71b (Step 10). The ashing process is carried out in accordance with the etching process. For instance, while supplying oxygen gas as the ashing gas from the ashing-gas supply system 24 to the chamber 11, an electric field E is produced between the shower head 20 and the support table 12 being the lower electrode to generate a plasma of oxygen-gas thereby performing the ashing process. FIG. 5C shows a state after completing the process at step 10.

By this ashing process, not only the resist film 69 but an exposed part of the organic film 65 to the trench 71b is removed from the wafer W. In this way, a part of the surface of the first insulation film 64 is exposed in the form of a bottom surface 64a of the trench 71b. Note, as the first insulation film 64 is hardly damaged at all by the ashing process, it is possible to make the bottom surface 64a of the trench 71b smooth. Additionally, since the removal of the organic film 65 (exposed part) is carried out synchronously with the removal of the resist film 69, an exclusive process is not required for the removal of the organic film 65. Thus, in comparison with the formation process of a groove interconnecting element by the conventional dual damascene method, there is no increase in the number of processes.

Figure 5D:
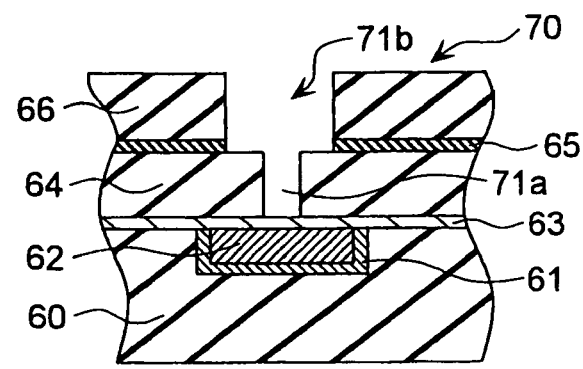

The wafer W after step 10 is transferred to the film-removal/cleaning apparatus 104 performing the removal of polymer residuals and the cleaning process. Thereafter, the wafer W is again transferred to the plasma-etching/ashing apparatus 103 performing the etching process to remove the sacrifice film 68 (Step 11). Consequently, an inversed convex-shaped groove interconnecting element where the via-hole 71a is communicated with the trench 71b is completed. FIG. 5D shows a state after completing the process at step 11.

Subsequently, the wafer W is subjected to an etching process to remove a part of the insulation film 60 below the via-hole 71a. By this etching process, the lower interconnection 62 is exposed to the outside. Therefore, the removal process of etch residues etc. is carried out to prevent the lower interconnection 62 from being oxidized etc. Further, a barrier-metal layer is formed on respective inner walls of the via-hole 71a and the trench 71b by CVD method or the like. In succession, a conductive material is embedded in the via-hole 71a and the trench 71b by CVD method or the like. Finally, the wafer W is subjected to a planarizing process by CMP method or the like. In this way, there can be provided a plug where the lower interconnection 62 and the via-hole 71a are electrically connected with each other.

Figure 6:
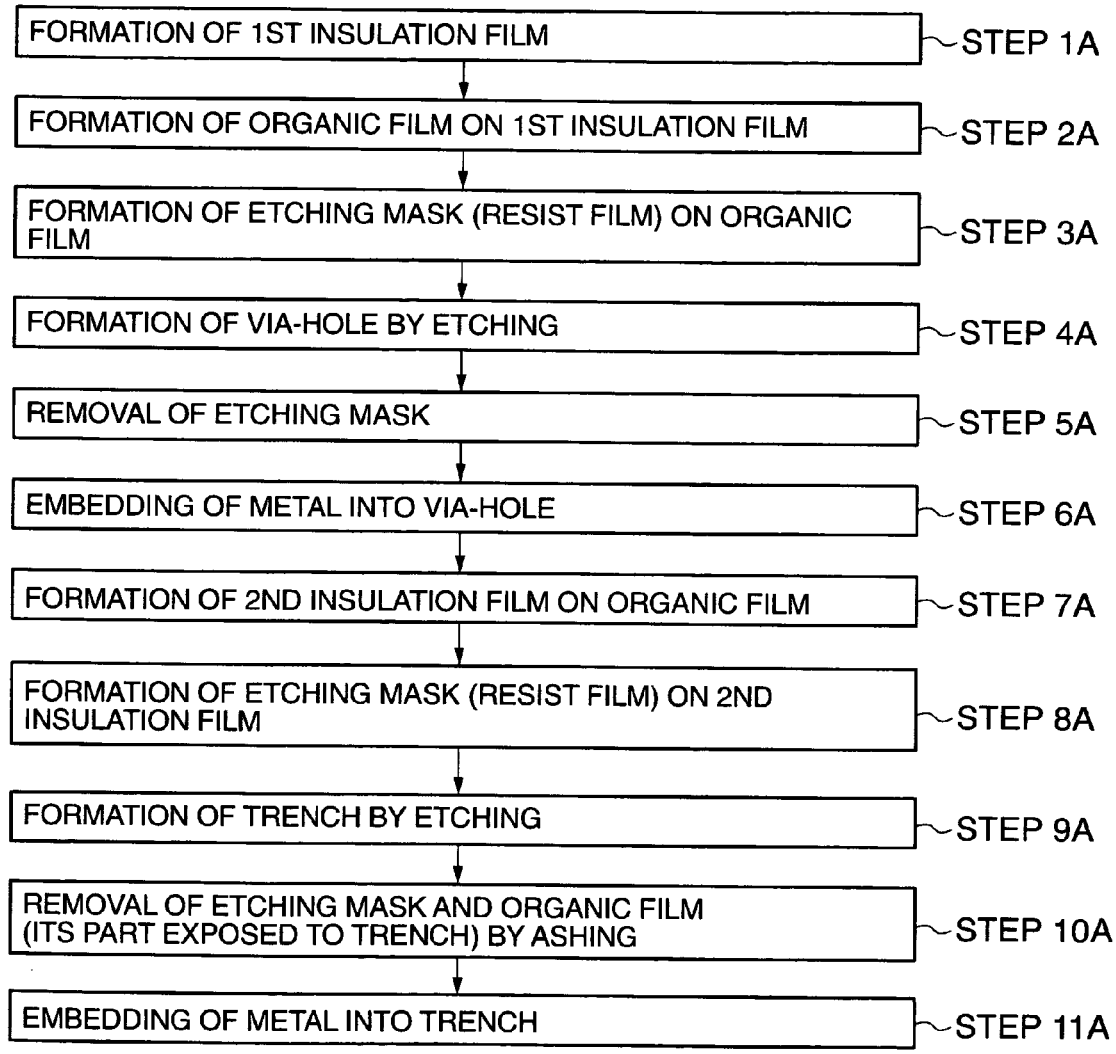
FIG. 6 is a flow chart showing another process of forming the groove interconnecting element in the dual damascene structure.
Figure 7A:
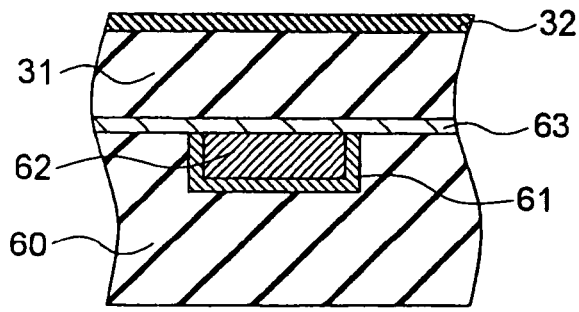
FIGS. 7A to 7E are explanatory views showing the sequential morphological change of insulation films etc. in the fabrication process of the groove interconnecting element in accordance with the flow chart of FIG. 6.

Next, we describe another method of forming a groove interconnecting element of dual damascene structure in insulation film layers formed on a wafer W. FIG. 6 is a flow chart showing the fabrication procedure of forming the groove interconnecting element of dual damascene structure. FIGS. 7A to 8C are explanatory views showing the sequential morphological change of insulation films etc. in the formation process of the groove interconnecting element. First of all, a wafer W (not shown in FIGS. 7A to 8C) is prepared. Here, this wafer W includes an insulation film 60 having a lower interconnection (e.g. copper interconnection) 62 formed therein through a barrier-metal layer 62. Further, the wafer W has a stopper film (e.g. SiN-film SiC-film) 63 formed on the surface of the insulation film 60. After preparing such a wafer W, a first insulation film 31 is formed on the stopper film 63 (Step 1A). Next, an organic film 32 is formed on the first insulation film 31 (Step 2A). FIG. 7A illustrates a lamination state after completing the process at step 2A.

Figure 7B:
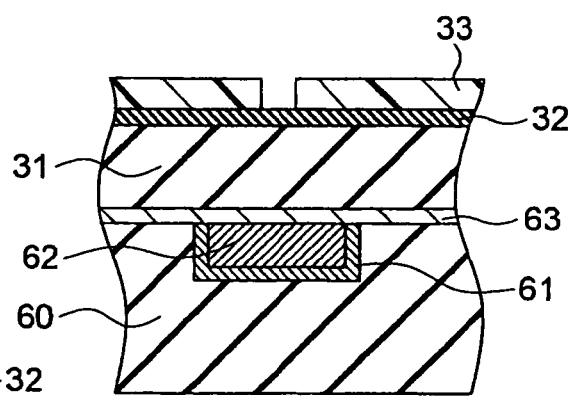
Figure 7C:
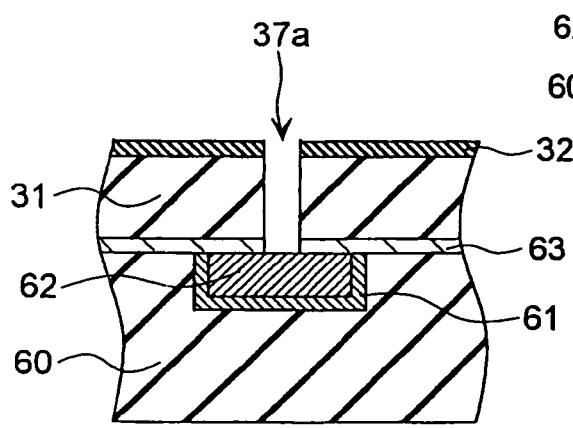

Then, a resist film 33 having a designated circuit pattern and therefore functioning as an etching mask is formed on the organic film 32 (Step 3A). FIG. 7B illustrates a state after completing the process at step 3A. Next, the etching process is applied to the wafer W to form a via-hole 37a according to the pattern of the resist film 33 in the first insulation film 31, the organic film 32 and the stopper film 63 (Step 4A). In this step, it is carried out to remove the resist film 33 by using chemical liquid etc (Step 5A). FIG. 7C shows a state after completing the process at step 5A.

Figure 7D:
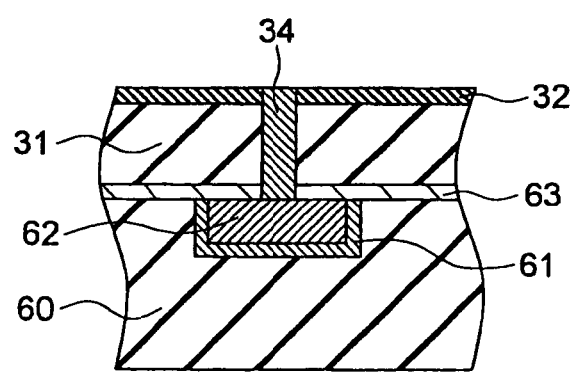

A conductive material, for example, metal 34 (e.g. copper) is embedded into the so-formed via-hole 37a and thereafter, the organic film 32 is flattened by CMP method etc (Step 6A). FIG. 7D shows a state after completing the process at step 6A. Note, removing the stopper film 63 may be carried out in the step 5A, but in the step 4A.

Figure 7E:
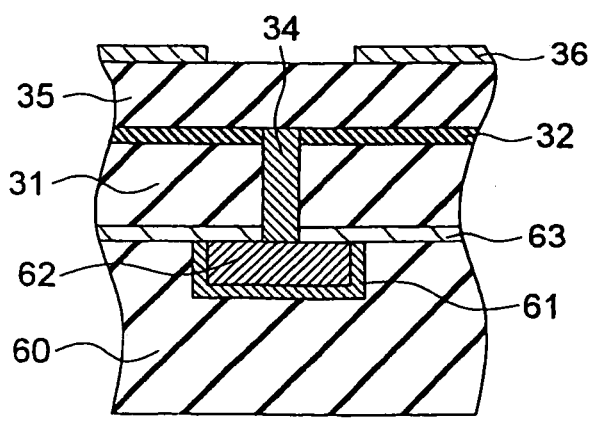
Figure 8A:
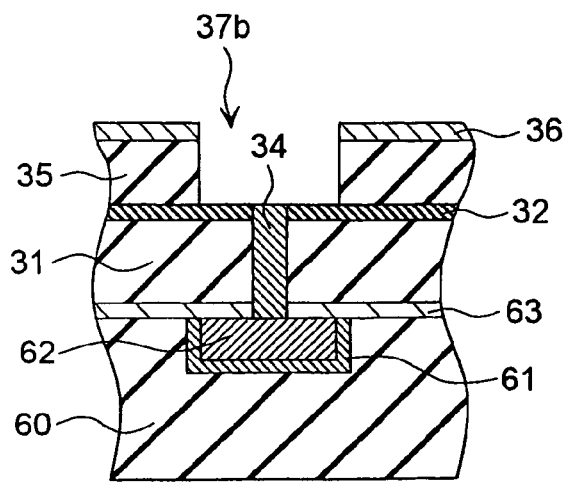
FIGS. 8A to 8C are explanatory views showing the sequential morphological change of insulation films etc. in the fabrication process of the groove interconnecting element in accordance with the flow chart of FIG. 6.

Subsequently, a second insulation film 35 is formed on the organic film 32 (Step 7A). In succession, a resist film 36 having a designated circuit pattern and therefore functioning as an etching mask is formed on the second insulation film 35 (Step 8A). FIG. 7E illustrates a state after completing the process at step 8A. Note, as shown in FIG. 7E, the width of a groove formed in the resist film 36 is established wider than the width of the via-hole 37a. Thereafter, the wafer W is subjected to the etching process to form a trench 37b according to the pattern of the resist film 36 in the second insulation film 35 (Step 9A). FIG. 8A shows a state after completing the process at step 9A.

Figure 8B:
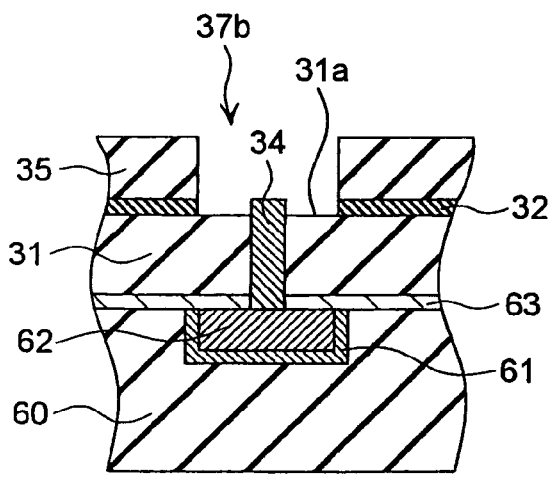

The wafer W having the trench 37b formed therein is subjected to the ashing process to remove the resist film 36 and an exposed part of the organic film 32 to the trench 37b (Step 10A). Due to this ashing process, it becomes possible to remove not only the resist film 36 but an exposed part of the organic film 32 to the trench 37. In this way, a part of the surface of the first insulation film 31 is exposed in the form of a bottom surface 31a of the trench 37. Note, as the first insulation film 31 is hardly damaged at all by the ashing process, it is possible to make the bottom surface 31a of the trench 37 smooth. FIG. 8B shows a state after completing the process at step 10A.

Figure 8C:
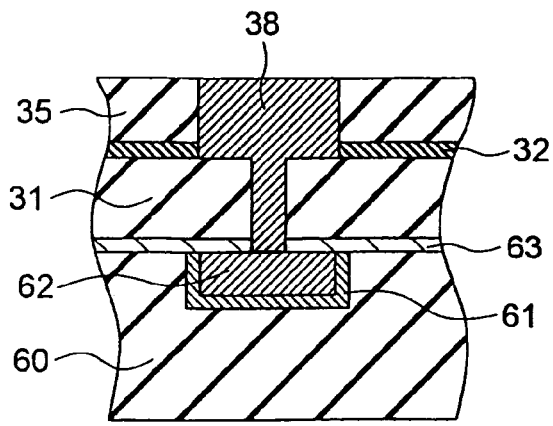
Figure 9A:
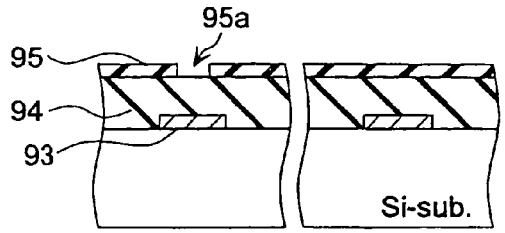
FIGS. 9A to 9E are explanatory views showing one example of the fabrication process of a multilayer interconnection in accordance with the conventional dual damascene technology.
Figure 9B:
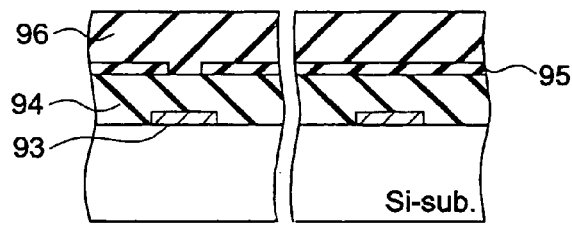
Figure 9C:
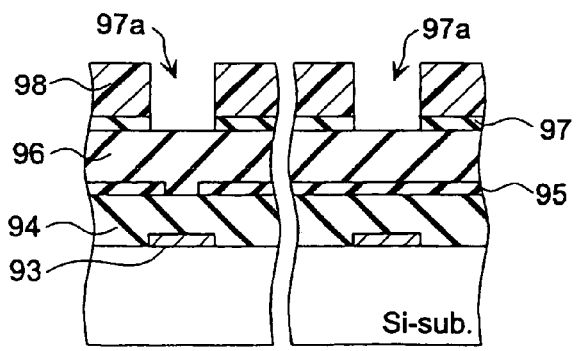
Figure 9D:
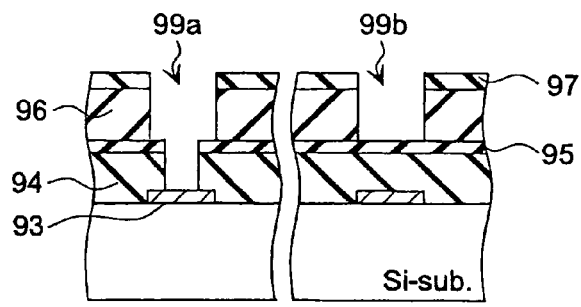
Figure 9E:
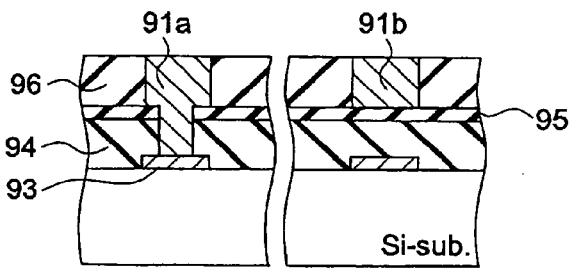
Figure 10A:
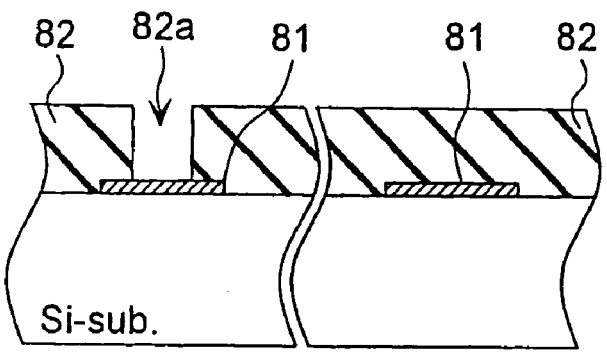
FIGS. 10A to 10C are explanatory views showing another example of the fabrication process of the multilayer interconnection in accordance with the conventional dual damascene technology.
Figure 10B:
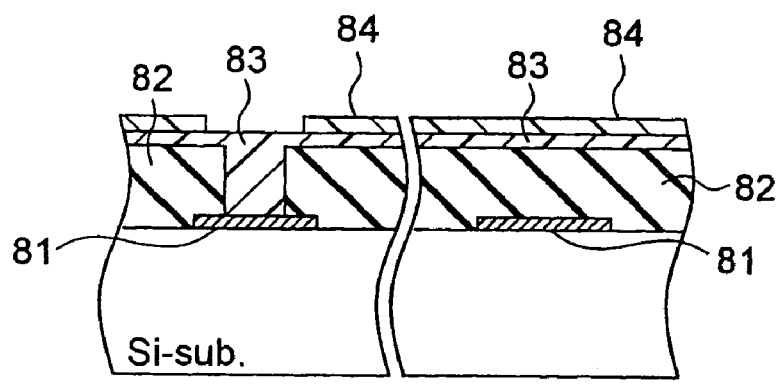
Figure 10C:
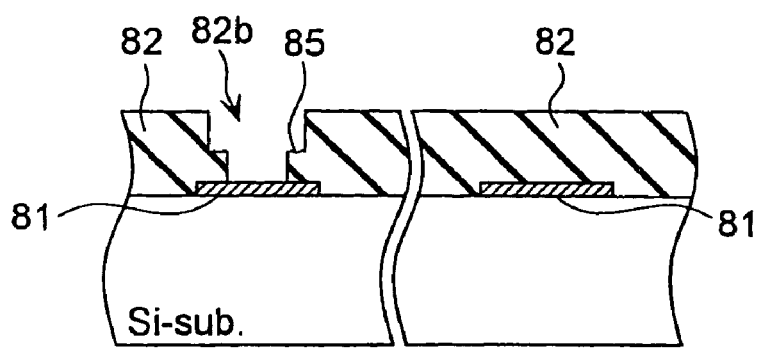

Metal, such as copper, is embedded in the so-formed trench 37b. Finally, the wafer W is subjected to a planarizing process by CMP method or the like (Step 11A). In this way, there can be provided a plug 38 where the metal embedded in the trench 37b and the metal 34 previously provided in the via-hole 37a are electrically connected with each other. FIG. 8C shows a state after completing the process at step 11A.

Hereinabove, we describe embodiments of the present invention. Nevertheless, the present invention is not limited to the above-mentioned embodiments only. For instance, regarding the processing steps shown in FIGS. 4A to 4E, the removal method of the resist film 67 is not limited to only the chemical processing but an ashing process. Further, the removal method of the sacrifice film 68 is not limited to only the etching process but a chemical processing.

In the above descriptions, it should be noted that the organic film is interposed between the insulation films in the event. In the modification, the organic film may be arranged between the stopper film and the insulation film. Then, owing to the interposition of the organic film, it is possible to suppress roughness of the top surface of the stopper film due to the etching process. In the above descriptions, a semiconductor wafer is representative of the substrate to be processed. Without being limited to only the wafer, the substrate to be processed may be any one of various ceramics substrates, glass substrate, etc.

According to the present invention, owing to the previous formation of the organic film between the first insulation film and the second insulation film, it is possible to produce a semiconductor device having a trench whose bottom surface is smooth. Here noted that the organic film is thin and its dielectric constant is small. Therefore, the increase in dielectric constant of the whole lamination film including the first insulation film, the organic film and the second insulation film can be suppressed. Additionally, since the removal of the organic film's part defining the trench can be carried out at the same time of removing the etching mask used in the etching process to form the trench, the present invention has an important advantage over the conventional manufacturing methods of semiconductor devices by reason that there is no need to add a new processing step to the existing procedure.

Finally, it will be understood by those skilled in the art that the foregoing descriptions are nothing but embodiments of the disclosed semiconductor device and manufacturing method thereof and therefore, various changes and modifications may be made within the scope of claims.

What is claimed is:

1. A manufacturing method of a semiconductor device having a groove interconnecting element of damascene structure, comprising the steps of:
    forming a first insulation film on a substrate to be processed;
    forming an organic film on the first insulation film;
    forming a second insulation film on the organic film;
    forming a via-hole penetrating the first insulation film, the organic film and the second insulation film;
    forming a sacrifice film consisting of inorganic material on the second insulation film so as to embed the sacrifice film in the via-hole;
    forming a resist film having a designated pattern on the sacrifice film;
    forming a trench reaching a top surface of the organic film in accordance with the designated pattern of the resist film; and
    removing both the resist film and an exposed part of the organic film to the trench, from the substrate to be processed, simultaneously by ashing,
    wherein a bottom surface of the trench is smoothed, and the sacrifice film serves as a protection against the ashing process for the second insulation film.

2. The manufacturing method of a semiconductor device as claimed in claim 1, wherein the first insulation film and/or the second insulation film is porous.

3. The manufacturing method of a semiconductor device as claimed in claim 1, wherein the step of removing an exposed part of the organic film to the trench is carried out by ashing.

4. The manufacturing method of a semiconductor device as claimed in claim 1, further comprising the step of forming a patterned lower interconnection on the surface of the substrate to be processed before the step of forming the first insulation film, wherein the via-hole is formed on the patterned lower interconnection.

5. The manufacturing method of a semiconductor device as claimed in claim 1, wherein a thickness of the organic film is 10 nm or more, and 50 nm or less.

6. The manufacturing method of a semiconductor device as claimed in claim 1, wherein a dielectric constant of the organic film is 3.5 or less.

7. The manufacturing method of a semiconductor device as claimed in claim 1, wherein the etching mask is a resist film, and not only the part of the organic film exposing to the trench but the resist film is removed simultaneously from the substrate to be processed in the step of removing the part of the organic film exposing to the trench from the substrate to be processed.

* * * * *